(12) United States Patent
Chen et al.

(10) Patent No.: US 9,397,168 B2
(45) Date of Patent: Jul. 19, 2016

(54) METHOD TO DEFINE THE ACTIVE REGION OF A TRANSISTOR EMPLOYING A GROUP III-V SEMICONDUCTOR MATERIAL

(71) Applicant: Taiwan Semiconductor Manufacturing Co., Ltd., Hsin-Chu (TW)

(72) Inventors: Po-Chih Chen, Hsinchu (TW); Jiun-Lei Jerry Yu, Zhudong Township (TW); Yu-Syuan Lin, Lukang Township (TW); Yao-Chung Chang, Zhubei (TW); King-Yuen Wong, Tuen Mun (HK)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/516,696

(22) Filed: Oct. 17, 2014

(65) Prior Publication Data

US 2016/0111501 A1    Apr. 21, 2016

(51) Int. Cl.
*H01L 29/66*    (2006.01)
*H01L 29/205*   (2006.01)
*H01L 29/417*   (2006.01)
*H01L 29/423*   (2006.01)
*H01L 29/06*    (2006.01)
*H01L 23/31*    (2006.01)
*H01L 29/778*   (2006.01)
*H03K 17/687*   (2006.01)

(52) U.S. Cl.
CPC .......... *H01L 29/205* (2013.01); *H01L 23/3171* (2013.01); *H01L 29/0642* (2013.01); *H01L 29/0692* (2013.01); *H01L 29/41758* (2013.01); *H01L 29/42376* (2013.01); *H01L 29/66462* (2013.01); *H01L 29/778* (2013.01); *H03K 17/687* (2013.01)

(58) Field of Classification Search
CPC ............ H01L 29/205; H01L 29/41758; H01L 29/778; H01L 23/3171; H01L 29/42376; H01L 29/0642; H01L 29/66462; H01L 29/0692; H03K 17/687
See application file for complete search history.

(56) References Cited

U.S. PATENT DOCUMENTS

2014/0077311 A1*  3/2014  Simin ............... H01L 29/66446
                                                           257/401

* cited by examiner

*Primary Examiner* — Roy Potter
*Assistant Examiner* — Paul Patton
(74) *Attorney, Agent, or Firm* — Eschweiler & Associates, LLC

(57) ABSTRACT

A group III-V transistor device employing a novel layout for isolating and/or defining the active region is provided. A group III-V heterojunction is arranged over or within a substrate, and an inner drain electrode is arranged over the group III-V heterojunction. A gate has a ring shape and is arranged over the group III-V heterojunction around the inner drain electrode. An outer source electrode has a ring-shaped region arranged over the group III-V heterojunction around the gate. A method for manufacturing the group III-V transistor device is also provided.

20 Claims, 8 Drawing Sheets

METHOD TO DEFINE THE ACTIVE REGION OF A TRANSISTOR EMPLOYING A GROUP III-V SEMICONDUCTOR MATERIAL

BACKGROUND

Semiconductor devices, such as transistors and photodiodes, based on silicon have been the standard for the past three decades. However, semiconductor devices based on alternative materials are receiving increasing attention for advantages over silicon-based semiconductor devices, such as higher electron mobility. Semiconductor devices based on group III-V semiconductor materials are one example of such semiconductor devices. A group III-V semiconductor material is a compound that includes at least one group III element and at least one group V element. Examples of group III-V semiconductor materials include gallium nitride (GaN), aluminum gallium nitride (AlGaN), gallium arsenide (GaAs), indium aluminum gallium nitride (InAlGaN), indium gallium nitride (InGaN), and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
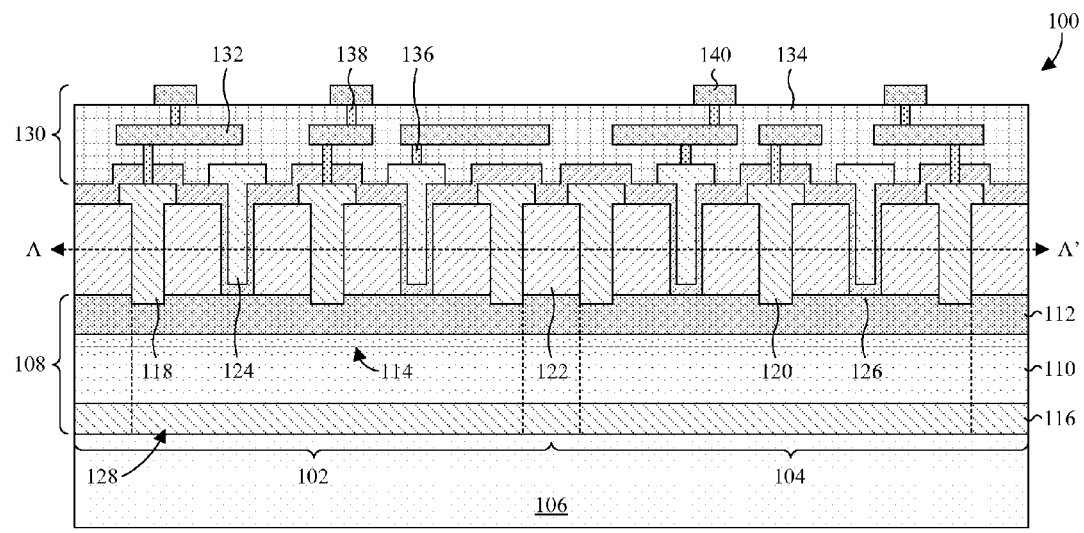
FIGS. 1A & B illustrate cross-sectional and top views of some embodiments of a pair of group III-V transistor devices having ring-shaped sources and ring-shaped gates arranged around drains for isolating and/or defining active regions.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Group III-V semiconductor devices are formed over and/or within corresponding active regions. An active region of such a device is a region that reversibly switches between different conductive states in response to external stimuli. For example, during use of a group III-V transistor device, the corresponding active region selectively switches between a conductive state and a non-conductive in response to biasing a gate. The active regions of neighboring group III-V semiconductor devices are typically isolated and/or defined by etching (e.g., mesa etching) or implantation. However, such approaches can damage the neighboring group III-V semiconductor devices and reduce device reliability.

Further, group III-V semiconductor devices are often formed asymmetrically. For example, group III-V transistor devices are often formed as parallel lines of sources, drains and gates. However, the asymmetry leads to non-uniform electric fields, such as crowded electric potential lines at the ends of the parallel lines.

In view of the foregoing, the present disclosure is directed to an improved method for isolating and/or defining the active regions of group III-V transistor devices. The improved method forms a drain, a ring-shaped gate around the drain, and a ring-shaped source around the ring-shaped gate. Such a layout isolates and/or defines an active region below the gate between the source and drain. Further, the drain is isolated from the source in all current flow directions, and by all layout types and dimensions. The present disclosure is also directed to the improved semiconductor structure resulting from performing the method.

The improved method and the improved semiconductor structure isolate and/or define neighboring active regions without any etching, implantation, or other group III-V material base device isolation methods. This, in turn, reduces induced traps caused by implantation or etching. Further, the improved method and the improved semiconductor structure achieve a more uniform electric field due to the symmetrical layout. By improving the uniformity of the electric field and performing isolation without etching, implantation, or other group III-V isolation methods, device reliability (e.g., as determined by a high temperature reverse bias (HTRB) test) and performance (e.g., reduced leakage current, such as off-state leakage current $I_{off}$) are advantageously improved. Further, beyond the improvements in device reliability and performance, costs are advantageously reduced since fewer masks and/or process stages (e.g., 2 fewer masks) are needed. There are no isolation masks and/or process stages.

Figure 1B:
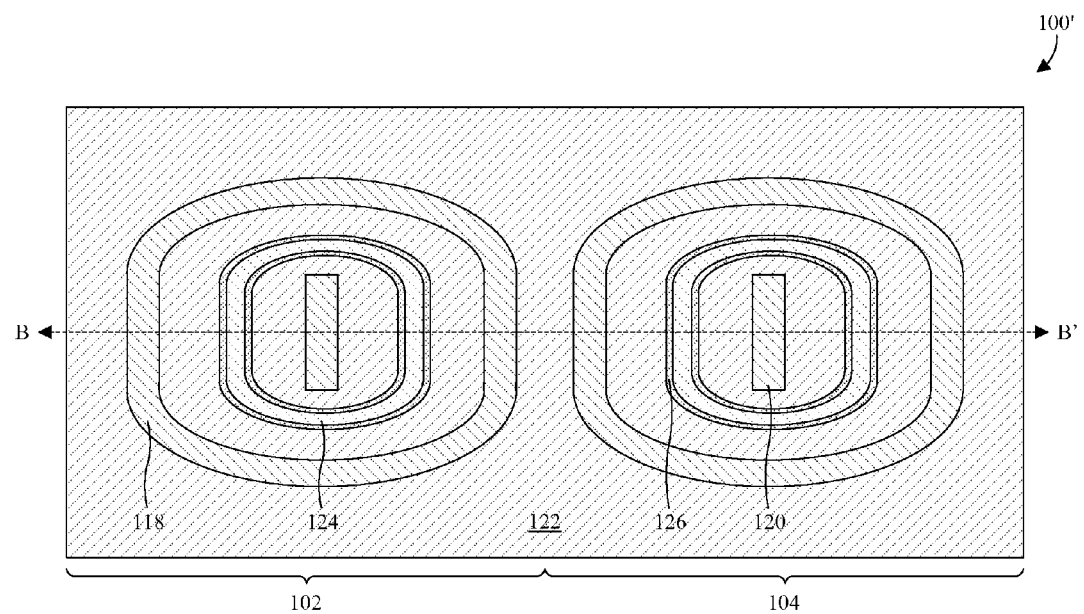

With reference to FIGS. 1A & B, cross-sectional and top views 100, 100' of some embodiments of a pair of group III-V transistor devices is provided. FIG. 1B is taken along line A-A' of FIG. 1A, and FIG. 1A is taken along line B-B' of FIG. 1B. The pair includes a first group III-V transistor device 102 and a second group III-V transistor device 104 arranged over and/or within a substrate 106. The substrate 106 is, for example, a silicon carbide substrate, a silicon substrate, or a sapphire substrate.

A group III-V region 108 of the first and second transistor devices 102, 104 is arranged over and/or within the substrate 106. The group III-V region 108 includes a group III-V semiconductor material. A group III-V semiconductor material is a compound that includes at least one group III element and at least one group V element. Examples of group III-V semiconductor materials include gallium nitride (GaN), aluminum gallium nitride (AlGaN), gallium arsenide (GaAs), indium aluminum gallium nitride (InAlGaN), indium gallium nitride (InGaN), and the like.

In some embodiments, the group III-V region 108 includes a channel layer 110 and a barrier layer 112. The barrier layer 112 is located directly on top of the channel layer 110, such that the top surface of the channel layer 110 and the bottom surface of the barrier layer 112 abut each other. At least one of the channel layer 110 and the barrier layer 112 is or otherwise includes a group III-V semiconductor material. Further, the barrier layer 112 includes a semiconductor material having a band gap unequal to (e.g., larger than) that of the channel layer 110. For example, the barrier layer 112 includes a thin film of AlGaN having a band gap that is larger than the band gap of the channel layer 110 having a thin film of GaN (AlGaN has a band gap of approximately 4 electron volts (eV), while GaN has a band gap of approximately 3.4 eV).

A heterojunction is collectively defined by the barrier layer 112 and the channel layer 110 at the interface of the channel layer 110 and the barrier layer 112. The heterojunction facilitates the selective transfer of electrons between the barrier layer 112 and a two-dimensional electron gas (2-DEG) 114 (demarcated by the dashed line) that forms, under proper conditions, in the channel layer 110 along the interface between the channel layer 110 and the barrier layer 112. This transfer can be controlled by electric fields generated by, for example, a gate. With a high concentration of electrons from the barrier layer 112, the 2-DEG 114 conducts.

In some embodiments, where the group III-V region 108 includes the channel and barrier layers 110, 112, the group III-V region 108 further includes one or more buffer layers 116 arranged between the substrate 106 and the channel layer 110. The buffer layers 116 have lattice constants that transition between a lattice constant of the substrate 106 and a lattice constant of the channel layer 110. The buffer layers 116 are or otherwise include, for example, aluminum nitride (AlN) or AlGaN.

Outer source electrodes 118 and inner drain electrodes 120 corresponding to the first and second transistor devices 102, 104 extend vertically through a passivation layer 122 to or into source/drain regions of the group III-V region 108. The passivation layer 122 is or otherwise includes, for example, silicon nitride, silicon oxynitride, or silicon oxide. In some embodiments, the inner and outer source/drain electrodes 118, 120 overhang the passivation layer 122 to define a T-shaped profile. Typically, there is a one-to-one correspondence between the inner drain electrodes 120 and the first and second transistor devices 102, 104, and between the outer source electrodes 118 and the first and second transistor devices 102, 104. The outer and inner source/drain electrodes 118, 120 are conductive and include a conductive material, such as, for example, titanium, nickel, aluminum, gold, copper, tungsten, or doped polysilicon. Further, the outer source electrodes 118 are ring-shaped and laterally surround the inner drain electrodes 120. The ring-shaped outer source electrodes 118 have outer boundaries laterally surrounding inner boundaries, and the inner drain electrodes 120 have outer boundaries, but no inner boundaries. The inner and outer boundaries can have any shape, such as a circle, square, rectangle, or triangle.

Gates 124 corresponding to the first and second transistor devices 102, 104 extend vertically through the passivation layer 122 to or into gate regions of the group III-V region 108. In some embodiments, the gates 124 overhang the passivation layer 122 to define a T-shaped profile. Typically, there is a one-to-one correspondence between the gates 124 and the first and second transistor devices 102, 104. The gates 124 are conductive and include a conductive material, such as, for example, titanium, nickel, aluminum, gold, copper, tungsten, or doped polysilicon. Further, the gates 124 are ring-shaped (e.g., circular, square, rectangular, or triangular ring-shaped) and laterally surround the inner drain electrodes 120 between the outer and inner source/drain electrodes 118, 120. The ring-shaped gates 124 have outer boundaries laterally surrounding inner boundaries, and the inner and outer boundaries can have any shape, such as a circle, square, rectangle, or triangle.

A dielectric layer 126 lines the bottom sides of the gates 124 to electrically isolate the gates 124 from the group III-V region 108 and the passivation layer 122. In some embodiments, the dielectric layer 126 further extends over the inner and outer source/drain electrodes 118, 120. The dielectric layer 126 is or otherwise includes a dielectric material, such as, for example, silicon oxide, silicon nitride, or silicon oxynitride.

Active regions 128 corresponding to the first and second transistor devices 102, 104 are arranged in the group III-V region 108 below the gates 124 between the inner and outer source/drain electrodes 118, 120. Typically, there is a one-to-one correspondence between the first and second transistor devices 102 and the active regions 128. The active regions 128 are regions of the group III-V region 108 within which conductive channels selectively form between the inner and outer source/drain electrodes 118, 120 in response to selectively biasing the gates 124. The layout of the inner and outer source/drain electrodes 118, 120 and the gates 124 defines the active regions 128 and electrically isolates the active regions 128 from neighboring active regions 128 without the use of etching, implant isolation, or other group III-V isolation methods. This is in spite of the group III-V region 108 extending continuously between the first and second transistor devices 102, 104 without any isolation, such as implant or etching isolation, within the group III-V region 108. Further, because the layout is symmetrical, the electric fields of the first and second transistor devices 102, 104 are uniform, and the inner drain electrode 120 is isolated from the outer source electrode 118 in all current flow directions, for all layout types and dimensions. By improving the uniformity of the electric field and performing isolation without etching or implantation, device reliability and performance are advantageously improved. Further, costs are advantageously reduced, since fewer masks are needed.

A back-end-of-line (BEOL) metallization stack 130 is arranged over the inner and outer source/drain electrodes 118, 120 and the gates 124. One or more metallization layers 132 are arranged within an interlayer dielectric (ILD) layer 134, and one or more contacts 136 electrically couple the inner and outer source/drain electrodes 118, 120 and the gates 124 to the metallization layers 132. Further, one or more vias 138 electrically couple the metallization layers 132 to bond pads 140 arranged over the ILD layer 134. The metallization layers 132, the contacts 136, the vias 138, and the bond pads 140 are conductive and formed from, for example, one or more copper, aluminum, aluminum copper, tungsten, gold, or silver.

The ILD layer 134 is or otherwise includes, for example, a low-κ dielectric (i.e., a dielectric with a dielectric constant κ less than 3.9), silicon dioxide, silicon oxynitride, or silicon nitride.

In some embodiments, a bias circuit (not shown) is electrically coupled to the first or second transistor device 102, 104 through the BEOL metallization stack 130. The bias circuit applies a bias voltage to the transistor device 102, 104 through the gate 124. Further, the bias circuit receives current flowing through the first or second transistor device 102, 104 from the outer source electrode 118 to the inner drain electrode 120. For example, the bias circuit applies a signal to the outer source electrode 118 and selectively receives the signal from the inner drain electrode 120 based on the applied bias voltage.

Figure 2A:
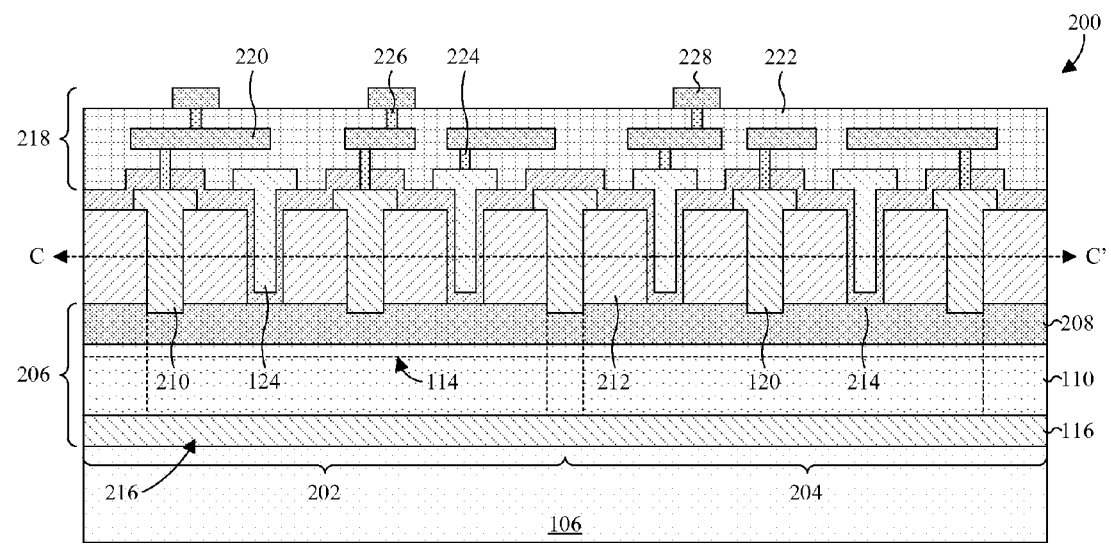
FIGS. 2A & B illustrate cross-sectional and top views of some embodiments of a multi-finger group III-V transistor device having a common, ring-shaped source and ring-shaped gates arranged around drains for isolating and/or defining active regions.
Figure 2B:
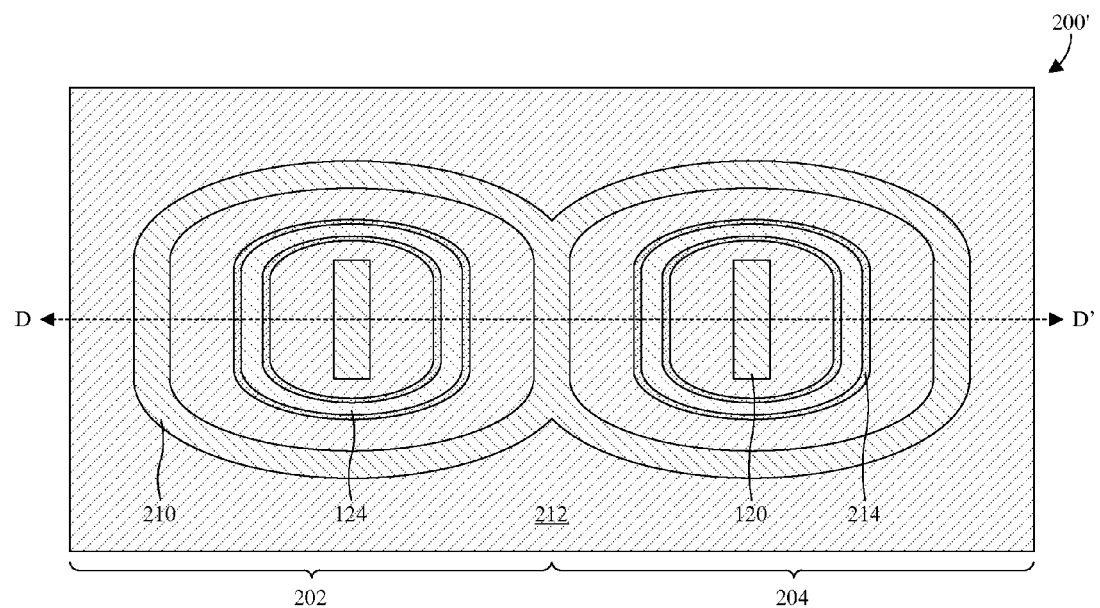

With reference to FIGS. 2A & B, cross-sectional and top views 200, 200' of some embodiments of a multi-finger group III-V transistor device is provided. FIG. 2B is taken along line C-C' of FIG. 2A, and FIG. 2A is taken along line D-D' of FIG. 2B. A multi-finger transistor device advantageously allows an increase in power transfer over conventional transistor devices (i.e., single-finger transistor devices). The multi-finger transistor device includes a plurality of fingers 202, 204 connected in parallel and arranged over and/or within a substrate 106. For example, the plurality of fingers 202, 204 include a first finger 202 and a second finger 204 arranged over and/or within a substrate 106. A finger corresponds to a transistor device region having an active region independent of the other fingers A group III-V region 206 of the multi-finger transistor device is arranged over and/or within the substrate 106. The group III-V region 206 includes a group III-V semiconductor material. A group III-V semiconductor material is a compound that includes at least one group III element and at least one group V element. Examples of group III-V semiconductor materials include GaN, AlGaN, GaAs, InAlGaN, InGaN, and the like.

In some embodiments, the group III-V region 206 includes a channel layer 110 and a barrier layer 208. The barrier layer 208 is located directly on top of the channel layer 110, such that the top surface of the channel layer 110 and the bottom surface of the barrier layer 208 abut each other. At least one of the channel layer 110 and the barrier layer 208 is or otherwise includes a group III-V semiconductor material. Further, the barrier layer 208 includes a semiconductor material having a band gap unequal to that of the channel layer 110. A heterojunction is collectively defined by the barrier layer 208 and the channel layer 110 at the interface of the channel layer 110 and the barrier layer 208. The heterojunction facilitates the selective transfer of electrons between the barrier layer 208 and a two-dimensional electron gas (2-DEG) 114 (demarcated by the dashed line) that forms, under proper conditions, in the channel layer 110 along the interface between the channel layer 110 and the barrier layer 208.

In some embodiments, where the group III-V region 206 includes the channel and barrier layers 110, 208, the group III-V region 206 further includes one or more buffer layers 116 arranged between the substrate 106 and the channel layer 110. The buffer layers 116 have lattice constants that transition between a lattice constant of the substrate 106 and a lattice constant of the channel layer 110.

A common, outer source electrode 210 and individual, inner drain electrodes 120 corresponding to the fingers 202, 204 extend vertically through a passivation layer 212 to or into source/drain regions of the group III-V region 206. The passivation layer 212 is or otherwise includes, for example, silicon nitride, silicon oxynitride, or silicon oxide. The inner drain electrodes 120 are shorted together, and in some embodiments, the inner and outer source/drain electrodes 120, 210 overhang the passivation layer 212 to define a T-shaped profile. Typically, there is a one-to-one correspondence between the inner drain electrodes 120 and the fingers 202, 204. The outer and inner source/drain electrodes 120, 210 are conductive and include a conductive material, such as, for example, titanium, nickel, aluminum, gold, copper, tungsten, or doped polysilicon. Further, the outer source electrode 210 laterally surrounds the inner drain electrodes 120 and includes a plurality of abutting, overlapping, and/or integrated ring-shaped regions corresponding to the fingers 202, 204. The Gates 124 are shorted together and correspond to the fingers 202, 204. Further, the gates 124 extend vertically through the passivation layer 212 to or into gate regions of the group III-V region 206. In some embodiments, the gates 124 overhang the passivation layer 212 to define a T-shaped profile. Typically, there is a one-to-one correspondence between the gates 124 and the fingers 202, 204. The gates 124 are ring-shaped (e.g., circular, square, rectangular, or triangular ring-shaped) and laterally surround the inner drain electrodes 120 between the outer and inner source/drain electrodes 120, 210.

A dielectric layer 214 lines the bottom sides of the gates 124 to electrically isolate the gates 124 from the group III-V region 206 and the passivation layer 212. In some embodiments, the dielectric layer 214 further extends over the inner and outer source/drain electrodes 120, 210. The dielectric layer 214 is or otherwise includes a dielectric material, such as, for example, silicon oxide, silicon nitride, or silicon oxynitride.

Active regions 216 corresponding to the fingers 202, 204 are arranged in the group III-V region 206 below the gates 124 between the inner and outer source/drain electrodes 120, 210. Typically, there is a one-to-one correspondence between the fingers 202, 204 and the active regions 216. The active regions 216 are regions of the group III-V region 206 within which conductive channels selectively form between the inner and outer source/drain electrodes 120, 210 in response to selectively biasing the gates 124. The layout of the inner and outer source/drain electrodes 120, 210 and the gates 124 defines the active regions 216 and electrically isolates the active regions 216 from neighboring active regions 216 without the use of etching, implant isolation, or other group III-V isolation methods. This is in spite of the group III-V region 206 extending continuously between the fingers 202, 204 without any isolation, such as implant or etching isolation, within the group III-V region 206. Further, because the layout is symmetrical, the electric fields of the first and second fingers 202, 204 are uniform, and the inner drain electrodes 120 is isolated from the common source electrode 210 in all current flow directions, for all layout types and dimensions. By improving the uniformity of the electric field and performing isolation without etching or implantation, device reliability and performance are advantageously improved. Further, costs are advantageously reduced.

A back-end-of-line (BEOL) metallization stack 218 is arranged over the inner and outer source/drain electrodes 120, 210 and the gates 124. One or more metallization layers 220 are arranged within an interlayer dielectric (ILD) layer 222, and one or more contacts 224 electrically couple the inner and outer source/drain electrodes 120, 210 and the gates 124 to the metallization layers 220. The metallization layers 220 electrically connect the gates 124 together via the contacts 224, and electrically connect the inner drain electrodes 120 together via the contacts 224. Further, one or more vias 226 electrically couple the metallization layers 220 to bond pads 228 arranged over the ILD layer 222. The metallization layers 220, the contacts 224, the vias 226, and the bond pads 228 are conductive and formed from, for example, one or more copper, aluminum, aluminum copper, tungsten, gold, or silver. The ILD layer 222 is or otherwise includes, for example, a low-κ dielectric (i.e., a dielectric with a dielectric constant κ less than 3.9), silicon dioxide, silicon oxynitride, or silicon nitride.

In some embodiments, a bias circuit (not shown) is electrically coupled to the multi-finger transistor device through the BEOL metallization stack 218. The bias circuit applies a bias voltage to the multi-finger transistor device through the gates 124. Further, the bias circuit receives current flowing through the multi-finger transistor device from the outer source electrode 210 to the inner drain electrodes 120. For example, the bias circuit applies a signal to the outer source electrode 210 and selectively receives the signal from the inner drain electrodes 120 based on the applied bias voltage.

Although the drain electrodes were described in FIGS. 1A & B, as well as in FIGS. 2A & B, as being surrounded by source electrodes, in alternative embodiments, the source electrodes are surrounded by the drain electrodes. For example, in these alternative embodiments, an outer, ring-shaped drain electrode surrounds a ring-shaped gate, which surrounds an inner source electrode.

Figure 3:
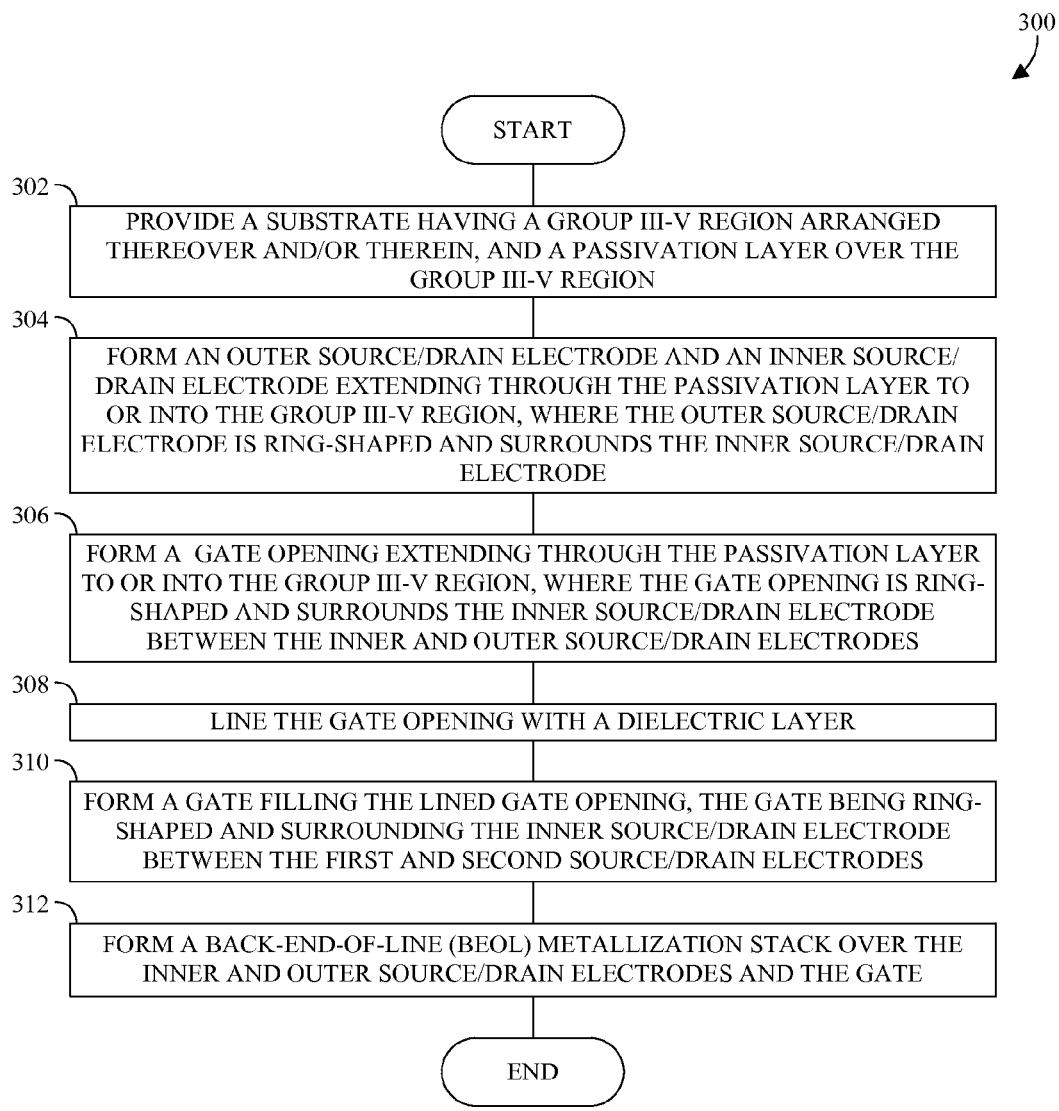
FIG. 3 illustrates a flow chart of some embodiments of a method for manufacturing a group III-V transistor device having a ring-shaped source and a ring-shaped gate arranged around a drain for isolating and/or defining an active region.

With reference to FIG. 3, a flowchart 300 provides some embodiments of a method for manufacturing a group III-V transistor device having a ring-shaped source and a ring-shaped gate arranged around a drain for isolating and/or defining an active region. An example of the resulting group III-V transistor device is shown in FIG. 1.

At Action 302, a substrate having a group III-V region arranged thereover and/or therein, and a passivation layer over the group III-V region, is provided.

At Action 304, an outer source electrode and an inner drain electrode are formed extending through the passivation layer to or into the group III-V region. The outer source electrode is ring-shaped and laterally surrounds the inner drain electrode.

At Action 306, a gate opening is formed extending through the passivation layer to or into the group III-V region. The gate opening is ring-shaped and laterally surrounds the inner drain electrode between the inner and outer source/drain electrodes.

At Action 308, the gate opening is lined with a dielectric layer.

At Action 310, a gate filling the lined gate opening is formed. The gate is ring-shaped and laterally surrounds the inner drain electrode between the inner and outer source/drain electrodes.

At Action 312, a BEOL metallization stack is formed over the inner and outer source/drain electrodes and the gate.

The method forms a group III-V transistor device with a layout facilitating definition and isolation of an active region between the inner and outer source/drain regions without the use of isolation etching or isolation implantation. Induced traps and device damage caused by implantation or etching are prevented. Further, the symmetry of the layout promotes a more uniform electric field. By improving the electric field, and reducing induced traps and device damage, device reliability and performance are improved. Moreover, costs are reduced because fewer masks are needed for device formation.

While the disclosed methods (e.g., the method described by the flowchart 300) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 4:
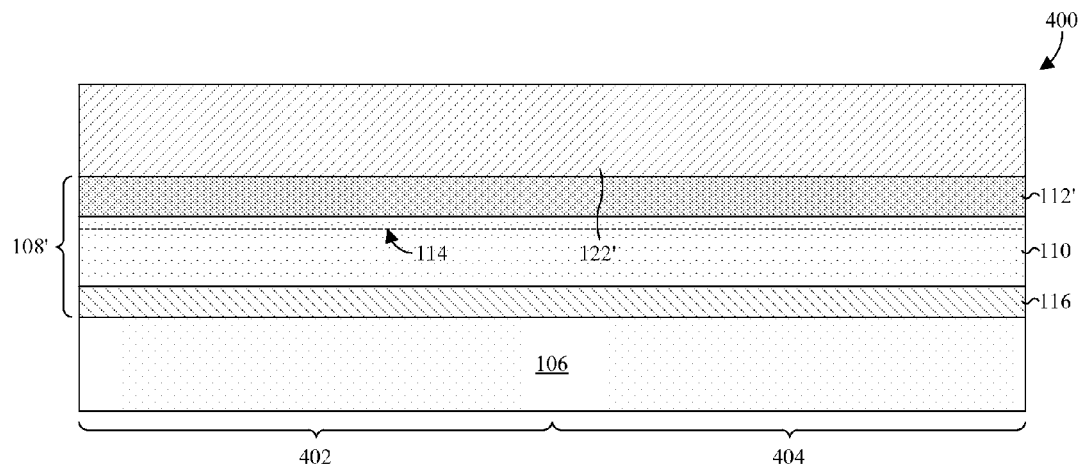
FIGS. 4, 5A & B, 6, 7A & B, and 8-10 illustrate a series of cross-sectional and top views of some embodiments of a pair of group III-V transistor devices at various stages of manufacture, the group III-V transistor devices having ring-shaped sources and ring-shaped gates arranged around drains for isolating and/or defining active regions.
Figure 5A:
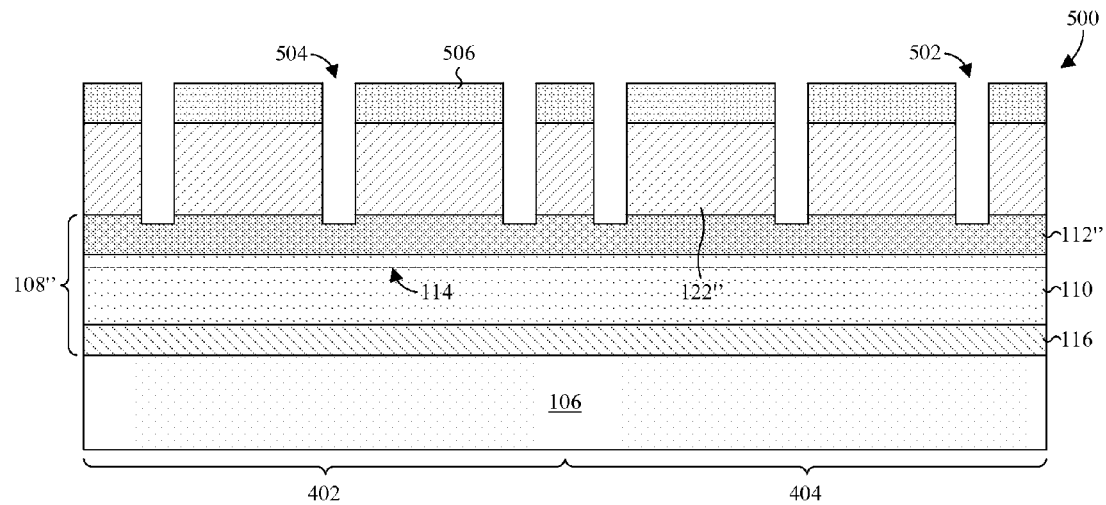
Figure 5B:
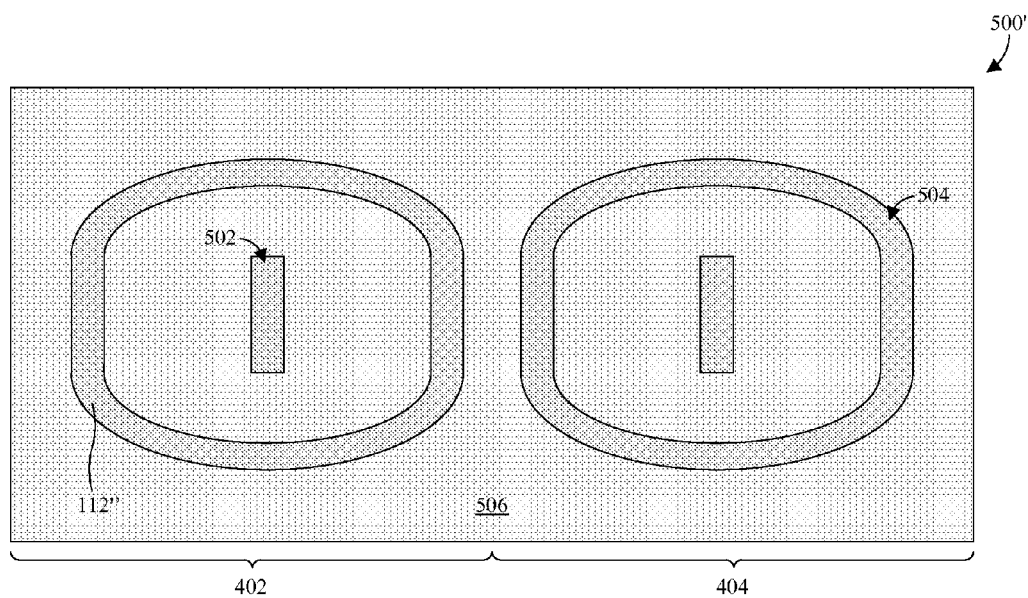

With reference to FIGS. 4, 5A & B, 6, 7A & B, and 8-10, cross-sectional and top views of some embodiments of a pair of group III-V transistor devices at various stages of manufacture are provided to illustrate the method of FIG. 3. Although FIGS. 4, 5A & B, 6, 7A & B, and 8-10 are described in relation to the method, it will be appreciated that the structures disclosed in FIGS. 4, 5A & B, 6, 7A & B, and 8-10 are not limited to the method, but instead may stand alone as structures independent of the method. Similarly, although the method is described in relation to FIGS. 4, 5A & B, 6, 7A & B, and 8-10, it will be appreciated that the method is not limited to the structures disclosed in FIGS. 4, 5A & B, 6, 7A & B, and 8-10, but instead may stand alone independent of the structures disclosed in FIGS. 4, 5A & B, 6, 7A & B, and 8-10.

FIG. 4 illustrates a cross-sectional view 400 of some embodiments corresponding to Action 302.

As shown by FIG. 4, a substrate 106 having a first transistor device region 402 and a second device region 404 is provided. The first and second device regions 402, 404 are regions of the substrate 106 over or within which group III-V transistor devices are formed. The substrate 106 is, for example, a silicon carbide substrate, a silicon substrate, or a sapphire substrate.

Also shown by FIG. 4, a group III-V region 108' is formed over and/or within the substrate 106. The group III-V region 108' includes a group III-V semiconductor material. A group III-V semiconductor material is a compound that includes at least one group III element and at least one group V element. In some embodiments, the group III-V region 108' includes a barrier layer 112' and a channel layer 110 within which a 2-DEG 114 forms under proper conditions.

Also shown by FIG. 4, a passivation layer 122' is formed over the group III-V region 108'. The passivation layer 122' is or otherwise includes, for example, silicon nitride, silicon oxynitride, or silicon oxide.

Also shown by FIG. 4, in some embodiments, one or more buffer layers 116 are formed over the substrate 106 below the channel layer 110. The buffer layers 116 have lattice constants that transition between a lattice constant of the substrate 106 and a lattice constant of the channel layer 110.

FIGS. 5A & B and 6 illustrate cross-sectional and top views 500, 600', 600 of some embodiments corresponding to Action 304.

As shown by FIGS. 5A & B, a first etch is performed through the passivation layer 122' to or into the group III-V region 108' to form outer source openings 502 and inner drain openings 504 corresponding to the first and second device regions 402, 404. The outer source openings 502 are ring-shaped and laterally surround the inner drain openings 504. Further, in some embodiments, the outer source openings 502 correspond to source regions, and the inner drain openings 504 correspond to drain regions. The process for the first etch can include, for example, forming a first photoresist layer over the passivation layer 122', patterning the first photoresist layer, applying an etchant to the patterned first photoresist layer 506 and the passivation layer 122', and removing the patterned first photoresist layer 506.

Figure 6:
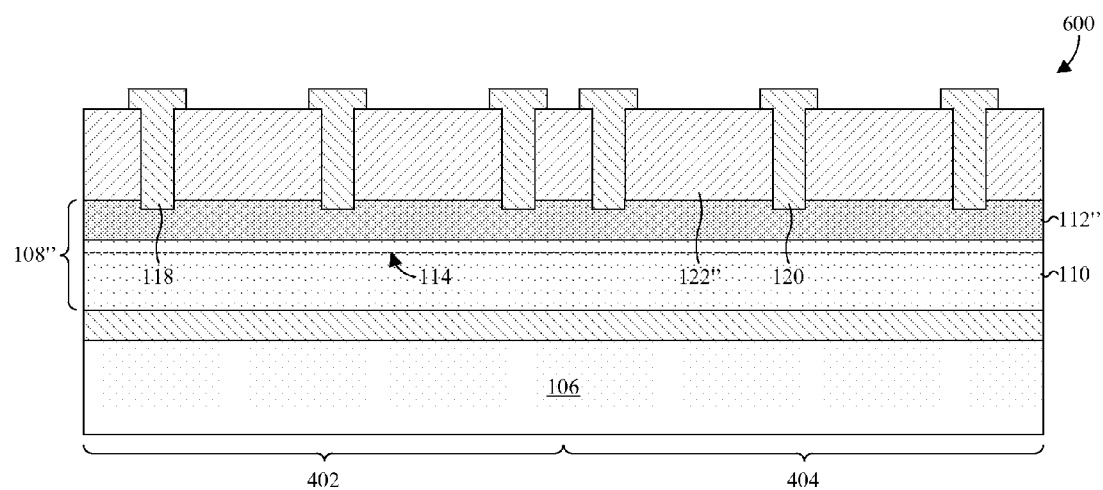

As shown by FIG. 6, inner and outer source/drain electrodes 118, 120 are correspondingly formed in the inner and outer source/drain openings 502, 504. In some embodiments, the inner and outer source/drain electrodes 118, 120 overhang the remaining passivation layer 122". The inner and outer source/drain electrodes 118, 120 can be formed by, for example, forming a conductive layer filling the inner and outer source/drain openings 502, 504 and then selectively etching the conductive layer. The inner and outer source/drain electrodes 118, 120 are conductive and include a conductive material, such as, for example, titanium, titanium nitride, aluminum, nickel, gold, copper, tungsten, or doped polysilicon.

Figure 7A:
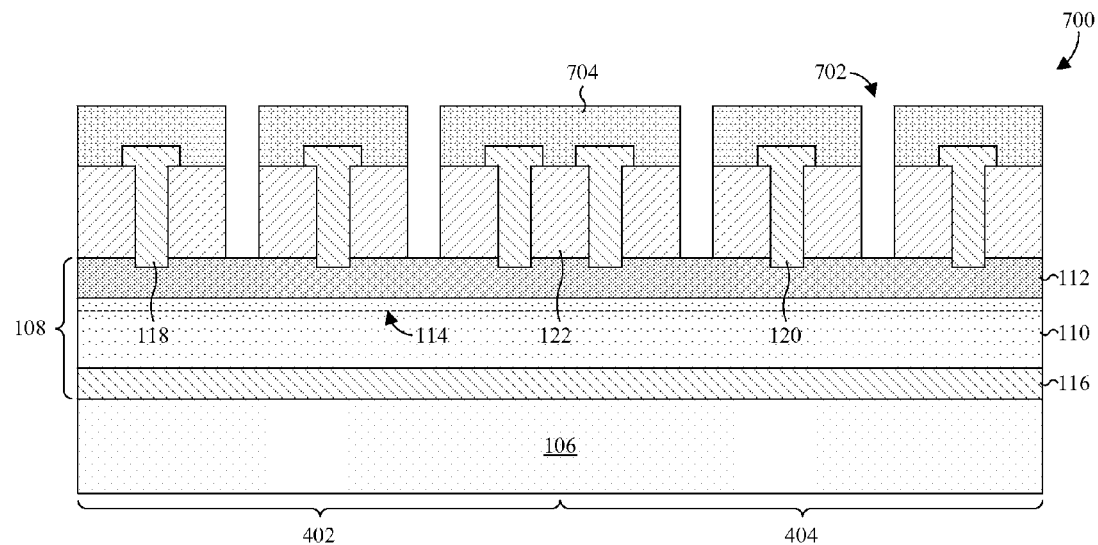
Figure 7B:
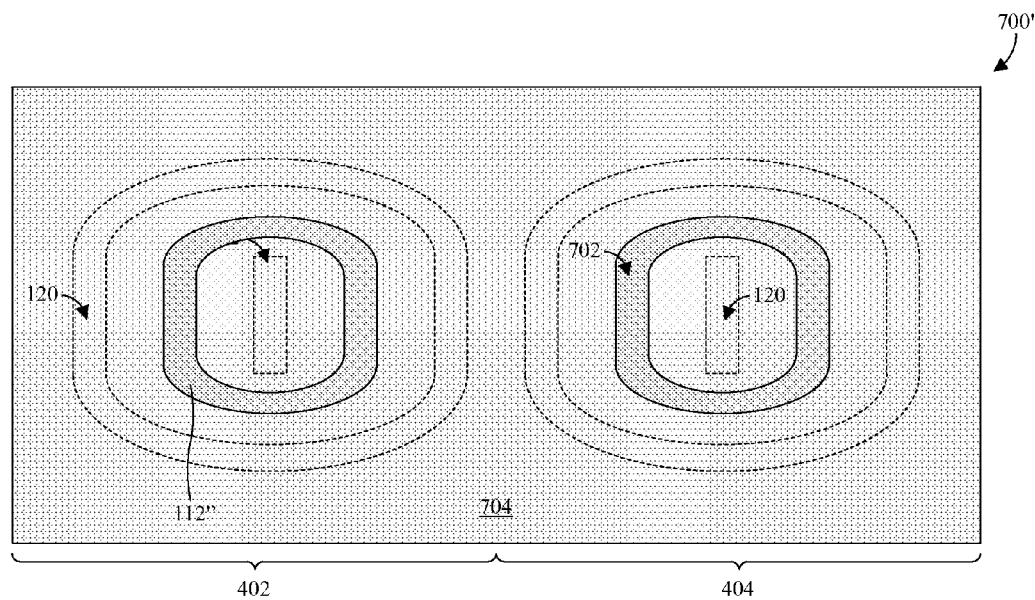

FIGS. 7A & B illustrate cross-sectional and top views 700, 700' of some embodiments corresponding to Action 306.

As shown by FIGS. 7A & B, a second etch is performed through the remaining passivation layer 122" to or into the remaining group III-V region 108", such as the remaining barrier layer 112', to form gate openings 702 corresponding to the first and second device regions 402, 404. The gate openings 702 are ring-shaped and arranged around the inner drain electrodes 120 between the outer source electrodes 118 and the inner drain electrodes 120. For example, for one of the first and second device regions 402, 404, an inner drain electrode 120 is surrounded by a gate opening 702, which is surrounded by an outer source electrode. The process for the second etch can include, for example, forming a second photoresist layer over the remaining passivation layer 122" and the inner and outer source/drain electrodes 118, 120, patterning the second photoresist layer, applying an etchant to the patterned second photoresist layer 704 and the remaining passivation layer 122", and removing the patterned second photoresist layer 704.

Figure 8:
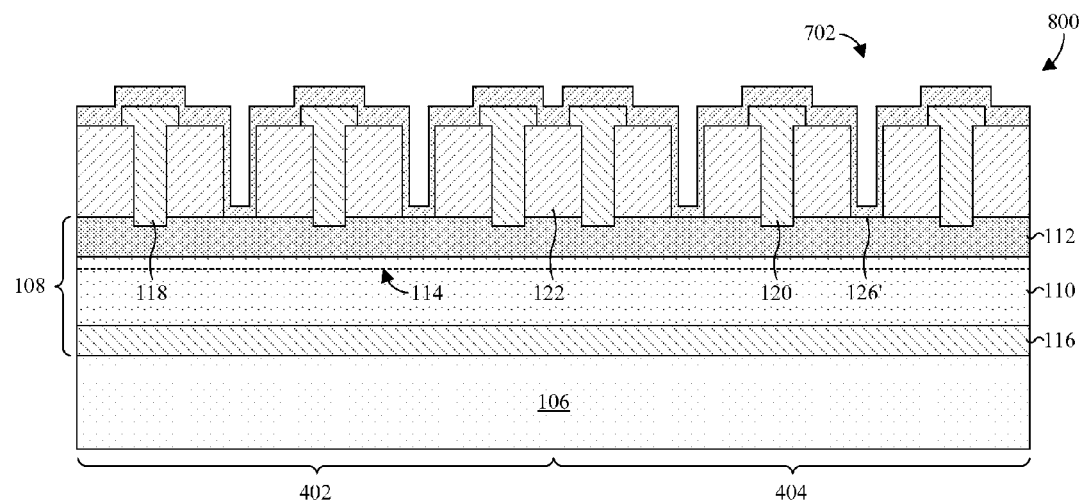

FIG. 8 illustrates a cross-sectional view 800 of some embodiments corresponding to Action 308.

As shown by FIG. 8, a first dielectric layer 126' is formed lining the gate openings 702. In some embodiments, the first dielectric layer 126' is also formed over the remaining passivation layer 122 and/or over the source/drain electrodes 118, 120. The first dielectric layer 126' is or otherwise includes a dielectric material, such as, for example, silicon oxide, silicon nitride, or silicon oxynitride.

Figure 9:
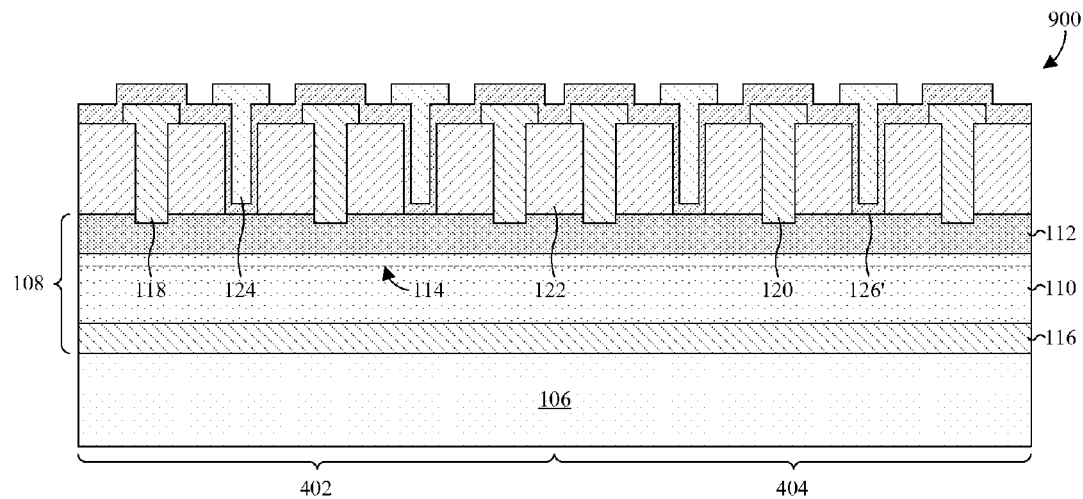

FIG. 9 illustrates a cross-sectional view 900 of some embodiments corresponding to Action 310.

As shown by FIG. 9, gates 124 are correspondingly formed in the gate openings 702 over the first dielectric layer 126'. In some embodiments, the gates 124 overhang the first dielectric layer 126'. The gates 124 have a ring shape and laterally surround the inner drain electrodes 120 between the inner and outer source/drain electrodes 118, 120. The gates 124 can be formed by, for example, forming a conductive layer filling the gate openings 702 and then selectively etching the conductive layer. The gates 124 are conductive and include a conductive material, such as, for example, titanium, titanium nitride, aluminum, nickel, gold, copper, tungsten, or doped polysilicon.

Figure 10:
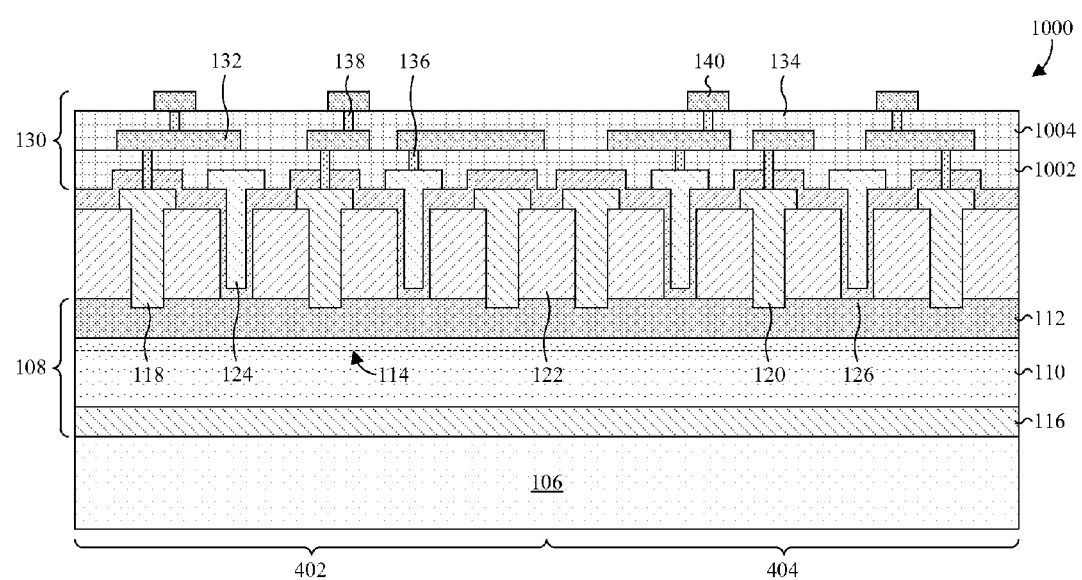

FIG. 10 illustrates a cross-sectional view 1000 of some embodiments corresponding to Action 312.

As shown by FIG. 10, a BEOL metallization stack 130 is formed over the inner and outer source/drain electrodes 118, 120, and the gates 124, through a series of layer depositions and etches. A second dielectric layer 1002 is formed over the inner and outer source/drain electrodes 118, 120 and the gates 124. One or more contacts 136 are formed extending through the second dielectric layer 1002 to electrically couple with the inner and outer source/drain electrodes 118, 120 and the gates 124. In some embodiments, the contacts 136 are further formed extending through the first dielectric layer 126' to the inner and outer source/drain electrodes 118, 120. One or more metallization layers 132 are formed over the second dielectric layer 1002 and in electrical communication with the contacts 136. A third dielectric layer 1004 is formed over the metallization layers 132, and one or more vias 138 are formed extending through the third dielectric layer 1004 to electrically couple with the metallization layers 132. Bond pads 140 are formed over the third dielectric layer 1004 and in electrically communication with the vias 138. The second and third dielectric layers 1002, 1004 are or otherwise include, for example, a low-κ dielectric, silicon dioxide, silicon oxynitride, or silicon nitride. The metallization layers 132, the contacts 136, the vias 138, and the bond pads 140 are or otherwise include, for example, one or more copper, aluminum, aluminum copper, tungsten, gold, or silver.

Thus, as can be appreciated from above, the present disclosure provides a group III-V transistor device. A group III-V heterojunction is arranged over or within a substrate, and an inner drain electrode is arranged over the group III-V heterojunction. A gate has a ring shape and is arranged over the group III-V heterojunction around the inner drain electrode. An outer source electrode has a ring-shaped region arranged over the group III-V heterojunction around the gate.

In other embodiments, the present disclosure provides a method for manufacturing a group III-V transistor device. An inner drain electrode and an outer source electrode are formed over a group III-V heterojunction. The outer source electrode has a ring-shaped region surrounding the inner drain electrode. A gate over the group III-V heterojunction is formed around the inner drain electrode between the outer and inner source/drain electrodes. The gate has a ring shape.

In yet other embodiments, the present disclosure provides a pair of neighboring group III-V transistor devices. First and second inner drain electrodes are arranged over a group III-V heterojunction. First and second gates correspond to the first and second inner drain electrodes. The first and second gates have a ring shape and are arranged over the group III-V heterojunction around the corresponding inner drain electrodes. First and second outer source electrodes correspond to the first and second gates. The first and second outer source electrodes have a ring shape and arranged over the group III-V heterojunction around the corresponding gates. A first active region is arranged below the first gate between the first inner and outer source/drain electrodes, and a second active region is arranged the second gate between the second inner and outer source/drain electrodes. A group III-V region includes the group III-V heterojunction and extends continuously between the first and second active regions without implant or etching isolation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A group III-V transistor device comprising:
    a group III-V heterojunction arranged over or within a substrate;
    an inner drain electrode arranged over the group III-V heterojunction;
    a gate having a ring shape, and arranged over the group III-V heterojunction and around the inner drain electrode;

an outer source electrode having a ring-shaped region arranged over the group III-V heterojunction and around the gate; and a passivation layer arranged over the group III-V heterojunction, wherein the inner drain electrode, the outer source electrode, and the gate extend through the passivation layer towards the group III-V heterojunction.

2. The group III-V transistor device according to claim 1, wherein the arrangement of the inner drain electrode, the outer source electrode, and the gate is configured to define and isolate an active region for the group III-V transistor device in the group III-V heterojunction, and wherein the active region is defined between outer sidewalls of the inner drain electrode and the outer source electrode.

3. The group III-V transistor device according to claim 1, further including:

a bias circuit configured to selectively receive current from the inner drain electrode, and configured to selectively apply a bias voltage to the gate, wherein current flows from the outer source electrode to the inner drain electrode.

4. The group III-V transistor device according to claim 1, further including:

a second inner drain electrode arranged over the group III-V heterojunction; and a second gate having a ring shape, and arranged over the group III-V heterojunction and around the second inner drain electrode;

wherein the outer source electrode has a second ring-shaped region arranged over the group III-V heterojunction and around the second gate, wherein the second ring-shaped region abuts or integrates with the ring-shaped region.

5. The group III-V transistor device according to claim 4, further including:

a first active region and a second active region respectively arranged below the gate and the second gate, wherein the first active region is spaced from the second active region; and a group III-V region including the first and second active regions and the group III-V heterojunction, and extending continuously between the first and second active regions without implant or etching isolation.

6. The group III-V transistor device according to claim 4, further including:

a back-end-of-line (BEOL) metallization stack configured to electrically couple the gate and the second gate together, and to electrically couple the inner drain electrode and the second inner drain electrode together.

7. The group III-V transistor device according to claim 1, further including:

a second inner drain electrode arranged over the group III-V heterojunction;

a second gate having a ring shape, and arranged over the group III-V heterojunction and around the second inner drain electrode; and a second outer source electrode having a ring-shaped region arranged over the group III-V heterojunction and around the second gate.

8. The group III-V transistor device according to claim 7, further including:

a first active region and a second active region respectively arranged below the gate and the second gate, wherein the first active region is spaced from the second active region; and a group III-V region including the first and second active regions and the group III-V heterojunction, and extending continuously between the first and second active regions without implant or etching isolation.

9. The group III-V transistor device according to claim 1, wherein the inner drain electrode and the outer source electrode extend through the passivation layer to a first location below a bottom surface of the passivation layer, and wherein the gate extends through the passivation layer to a second location above the bottom surface of the passivation layer.

10. The group III-V transistor device according to claim 1, further comprising:

a dielectric layer conformally covering the inner drain electrode and the outer source electrode, and further conformally lining a lower surface of the gate.

11. A method for manufacturing a group III-V transistor device, said method comprising:

forming an inner drain electrode and an outer source electrode over a group III-V heterojunction, wherein the outer source electrode has a ring-shaped region surrounding the inner drain electrode;

forming a gate over the group III-V heterojunction, around the inner drain electrode, and between the outer source electrode and the inner drain electrode, wherein the gate has a ring shape;

forming a second inner drain electrode and a second outer source electrode over the group III-V heterojunction, wherein the second outer source electrode is ring-shaped and surrounds the second inner drain electrode; and forming a second gate over the group III-V heterojunction, around the second inner drain electrode, and between the second outer source electrode and the second inner drain electrode, wherein the second gate has a ring shape.

12. The method according to claim 11, further including:

forming a gate opening towards the group III-V heterojunction between the outer source electrode and the inner drain electrode, wherein the gate opening has a ring shape;

lining the gate opening with a dielectric layer; and forming the gate over the dielectric layer and within the gate opening.

13. The method according to claim 11, further including:

forming a passivation layer over the group III-V heterojunction; and forming the inner drain electrode, the outer source electrode, and the gate extending through the passivation layer towards the group III-V heterojunction.

14. The method according to claim 11, further including:

defining and isolating an active region for the group III-V transistor device between outer sidewalls of the inner drain electrode and the outer source electrode without implant or etching isolation.

15. The method according to claim 11, further including:

forming a bias circuit electrically coupled to the inner drain electrode, to the outer source electrode, and to the gate, wherein the bias circuit includes an input electrically coupled to the inner drain electrode, and wherein the bias circuit includes an output electrically coupled to the outer source electrode.

16. The method according to claim 11, further including:

defining a first active region and a second active region respectively below the gate and the second gate, wherein the first active region is spaced from the second active region; and forming a group III-V region including the first and second active regions and the group III-V heterojunction, and extending continuously between the first and second active regions without implant or etching isolation.

17. The method according to claim 13, further comprising:
performing a first etch into the passivation layer to form respective first openings for the inner drain electrode, the second inner drain electrode, the outer source electrode, and the second outer source electrode;
forming the inner drain electrode, the second inner drain electrode, the outer source electrode, and the second outer source electrode in the respective first openings;
performing a second etch into the passivation layer to form respective second openings for the gate and the second gate; and
forming the gate and the second gate in the respective second openings.

18. The method according to claim 17, further comprising:
forming a dielectric layer conformally covering the inner drain electrode, the second inner drain electrode, the outer source electrode, and the second outer source electrode, and further lining the second openings; and
forming the gate and the second gate over the dielectric layer.

19. A pair of neighboring group III-V transistor devices, the pair comprising:
first and second inner drain electrodes arranged over a group III-V heterojunction;
first and second gates corresponding to the first and second inner drain electrodes, wherein the first and second gates have a ring shape, and wherein the first and second gates are arranged over the group III-V heterojunction and around the corresponding inner drain electrodes;
first and second outer source electrodes corresponding to the first and second gates, wherein the first and second outer source electrodes each has an individual ring shape, wherein the individual ring shapes of the first and second outer source electrodes are merged together, and wherein the first and second outer source electrodes are arranged over the group III-V heterojunction and around the corresponding gates;
a first active region arranged below the first gate, between the first inner drain electrode and the first outer source electrode;
a second active region arranged below the second gate, between the second inner drain electrode and the second outer source electrode; and
a group III-V region including the group III-V heterojunction and extending continuously between the first and second active regions without implant or etching isolation.

20. The pair of neighboring group III-V transistor devices of claim 19, further comprising:
a passivation layer arranged over the group III-V heterojunction, wherein the first and second inner drain electrodes, the first and second outer source electrodes, and the first and second gates extend into the passivation layer towards the group III-V heterojunction.

* * * * *